(12) United States Patent
Erturk et al.

(10) Patent No.: US 8,193,893 B2
(45) Date of Patent: Jun. 5, 2012

(54) INDUCTOR HAVING OPENING ENCLOSED WITHIN CONDUCTIVE LINE AND RELATED METHOD

(75) Inventors: Mete Erturk, St. Albans, VT (US); John D. Gillis, Milton, FL (US); Casey J. Grant, Hinesburg, VT (US); David Scagnelli, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 12/055,336

(22) Filed: Mar. 26, 2008

(65) Prior Publication Data

US 2009/0243778 A1 Oct. 1, 2009

(51) Int. Cl.
*H01F 5/00* (2006.01)
*H01F 27/28* (2006.01)
(52) U.S. Cl. .................. 336/200; 336/223; 336/232
(58) Field of Classification Search .................. 336/200, 336/223, 232; 716/5, 12
See application file for complete search history.

(56) References Cited

U.S. PATENT DOCUMENTS

| | | | |
|---|---|---|---|
| 4,392,013 A | 7/1983 | Ohmura et al. | |
| 5,015,972 A * | 5/1991 | Cygan et al. | 333/32 |
| 5,872,489 A | 2/1999 | Chang et al. | |
| 6,588,002 B1 * | 7/2003 | Lampaert et al. | 716/8 |
| 6,812,819 B2 | 11/2004 | Le Grand de Mercey et al. | |
| 6,847,284 B2 * | 1/2005 | Gamou et al. | 336/223 |
| 6,894,598 B2 * | 5/2005 | Heima | 336/200 |
| 6,922,128 B2 | 7/2005 | Vilander et al. | |
| 6,937,128 B2 | 8/2005 | Contopanagos et al. | |
| 7,403,090 B2 * | 7/2008 | Kita | 336/200 |
| 2003/0214380 A1 | 11/2003 | Le Grand de Mercey et al. | |
| 2003/0237059 A1 | 12/2003 | Schultz | |
| 2004/0075521 A1 * | 4/2004 | Yu et al. | 336/200 |
| 2004/0140878 A1 | 7/2004 | Heima | |
| 2008/0094166 A1 * | 4/2008 | Hsu et al. | 336/223 |
| 2008/0284553 A1 * | 11/2008 | Lim et al. | 336/200 |

OTHER PUBLICATIONS

Lopez-Villegas et al., "Improvement of the Quality Factor of RF Integrated Inductors by Layout Optimization," IEEE Transactions on Microwave Theory and Techniques, vol. 48, No. 1, Jan. 2000, pp. 76-83.

PCT/US2009/037738, "PCT International Search Report and Written Opinion", Jun. 26, 2009, 8 pages.

Lopez-Villegas et al., "Improvement of the Quality Factor of RF Integated Inductors by Layout Optimization", IEEE Transactions on Microwave Theory and Techniques, vol. 48, No. 1, Jan. 2000, pp. 76-73.

* cited by examiner

*Primary Examiner* — Elvin G Enad
*Assistant Examiner* — Ronald Hinson
(74) *Attorney, Agent, or Firm* — Anthony J. Canale; Hoffman Warnick LLC (57) ABSTRACT

Embodiments of an inductor including a conductive line including at least one turn and an opening positioned within an interior of a region of the conductive line are disclosed. Embodiments of a related method of designing the inductor are also disclosed.

18 Claims, 9 Drawing Sheets

INDUCTOR HAVING OPENING ENCLOSED WITHIN CONDUCTIVE LINE AND RELATED METHOD

BACKGROUND

1. Technical Field

The disclosure relates generally to integrated circuit (IC) chip fabrication, and more particularly, to inductors for use in IC chips and related methods.

2. Background Art

Figure 1:
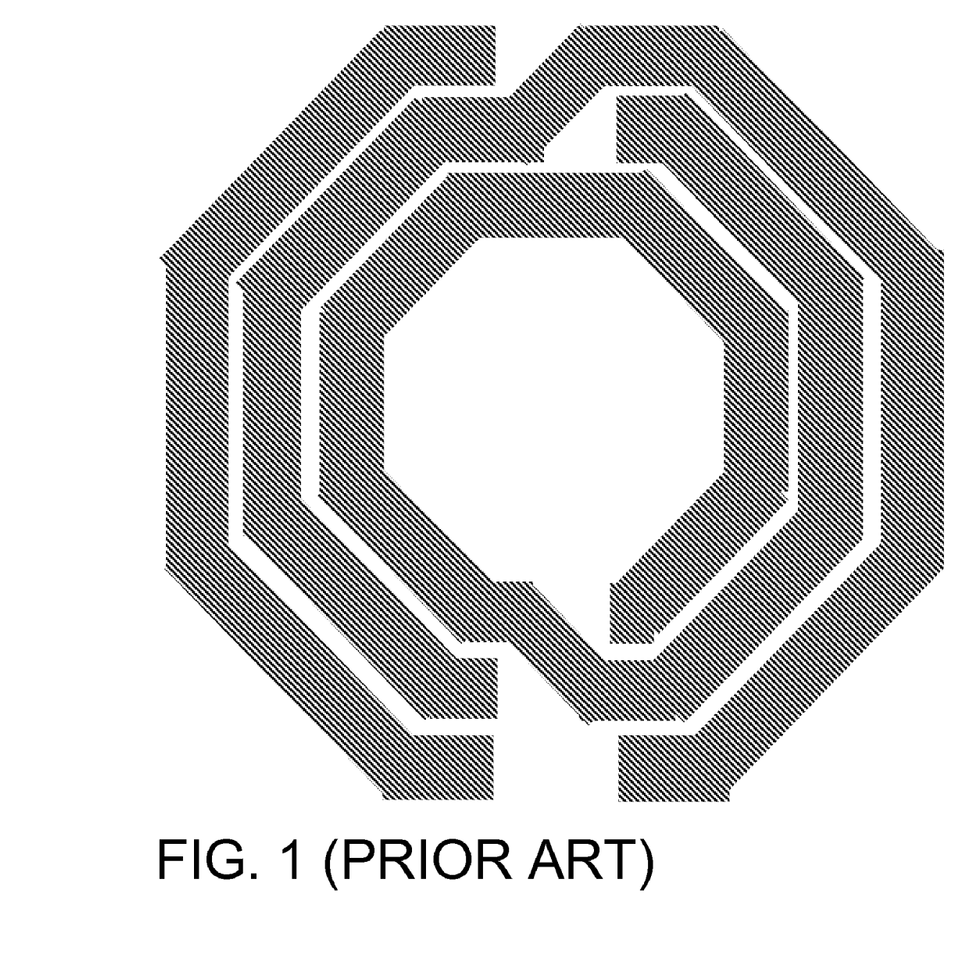
FIG. 1 shows a conventional inductor.

An inductor is a passive electrical structure used in electrical circuits for its property of inductance. An inductor can take many forms. Building high-quality on-chip inductors has attracted tremendous interest for radio frequency integrated circuit (RFIC) design and integrated circuit (IC) chip manufacturers. In particular, high-quality on-chip inductors have been widely demonstrated as a key factor for successfully integrating RF building blocks. As shown in FIG. 1, inductors currently require wide metal lines (e.g., 15-20 μm) and a large number of turns with narrow spacing to provide a competitive quality factor (Q factor). Q factor of an inductor is equal to the ratio of an inductive reactance (stored energy) thereof to a resistance (loss) thereof at a given frequency, and is an indication of an inductor's efficiency. Generally, as line width increases, line impedance decreases—increasing the Q factor.

There are several disadvantages associated with the current industry standard layout which uses wide solid metal lines. First, as the width of lines used increases, the Q factor increase is limited due to an increase in substrate capacitance at high frequency, which also causes a reduced self-resonance frequency. Second, Eddy current effects increase as metal line widths increase, particularly for multiple turn inductors with many adjacent metal traces. Eddy current refers to the electrical situation in which a changing magnetic field intersects a conductor creating a circulating flow of electrons within the conductor, which generates electromagnetic fields that oppose an applied magnetic field. Eddy currents increase resistance at RF frequencies, further reducing the inductor Q factor.

Third, the conventional manufacturing of inductors from copper (Cu) is very difficult due to manufacturing process sensitivities associated with high local pattern densities, i.e., a large amount of metal structures within a given area. For example, chemical mechanical polish (CMP) is prone to over-polish high pattern density regions, which can impact the sheet resistance significantly. Severe over-polish can also result in subsequent level shorting, as topography degradation replicates through downstream levels and processing. Manufacturing is particularly sensitive to regions of high stacked metal density, which is common in multi-level spiral inductors. The standard method of placing blanket holes (or cheesing) the metal structures randomly to reduce pattern density after layout submission for manufacturing is not optimal for inductors because the sheet resistance increases, thereby negatively impacting the Q factor. The random cheesing of inductors also introduces compact model inaccuracy and asymmetry in geometries where symmetry may be critical.

SUMMARY

Embodiments of an inductor including a conductive line including at least one turn and an opening positioned within an interior of a region of the conductive line are disclosed. Embodiments of a related method of designing the inductor are also disclosed.

A first aspect of the disclosure provides a method comprising: providing an inductor design including a conductive line having at least one turn; determining a region of the conductive line that has current density below a threshold; and forming an opening in the region, the opening enclosed within the conductive line.

A second aspect of the disclosure provides an inductor comprising: a conductive line including at least one turn and an opening positioned within an interior of a region of the conductive line.

A third aspect of the disclosure provides an integrated circuit (IC) comprising: an inductor including a conductive line including at least one turn and an opening positioned within an interior of a region of the conductive line.

A fourth aspect of the disclosure provides a design structure embodied in a machine readable medium for designing, manufacturing, or testing an integrated circuit, the design structure comprising: an inductor including a conductive line including at least one turn and an opening positioned within an interior of a region of the conductive line.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 2:
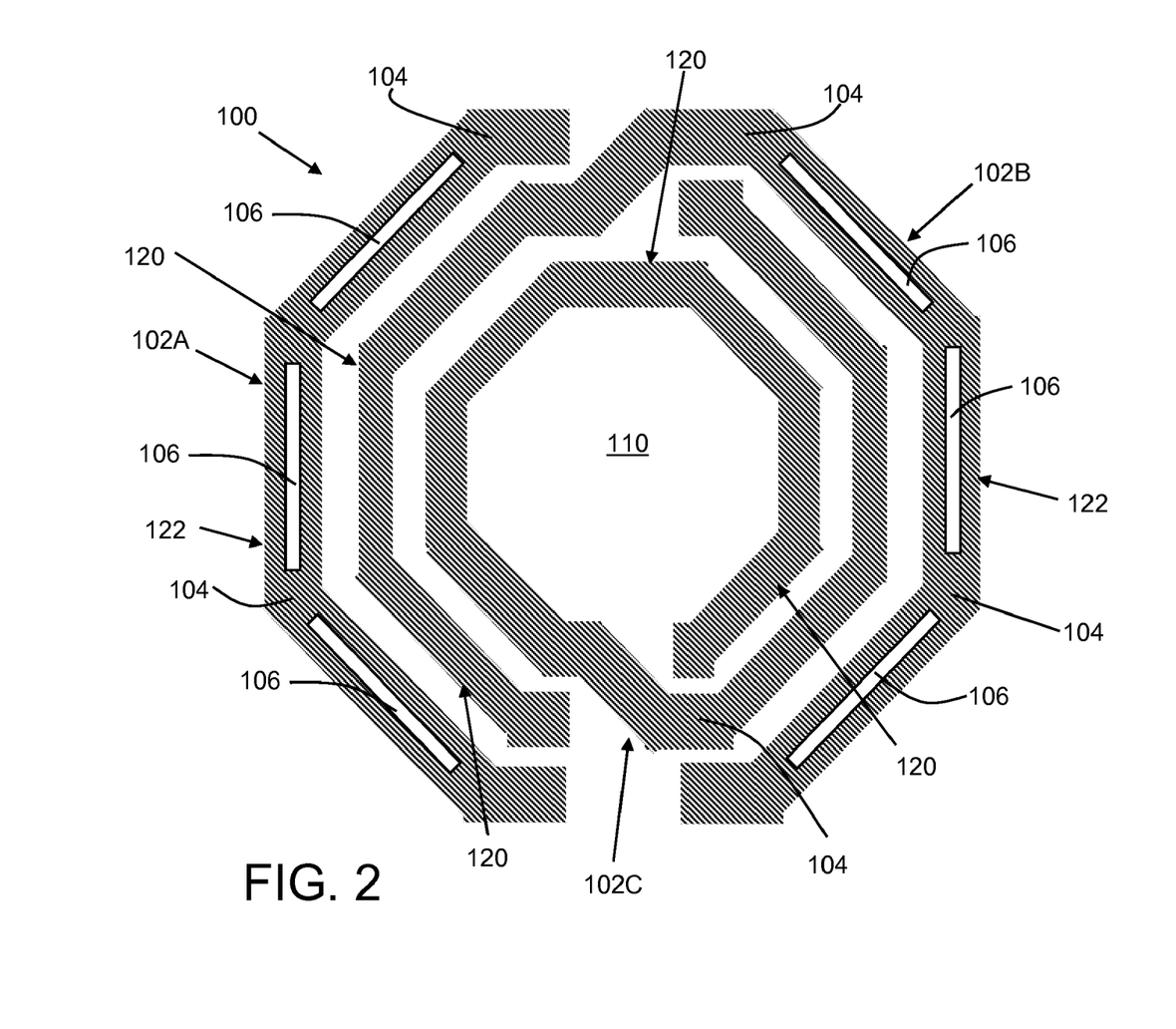
FIG. 2 shows embodiments of an inductor according to the disclosure.
Figure 9:
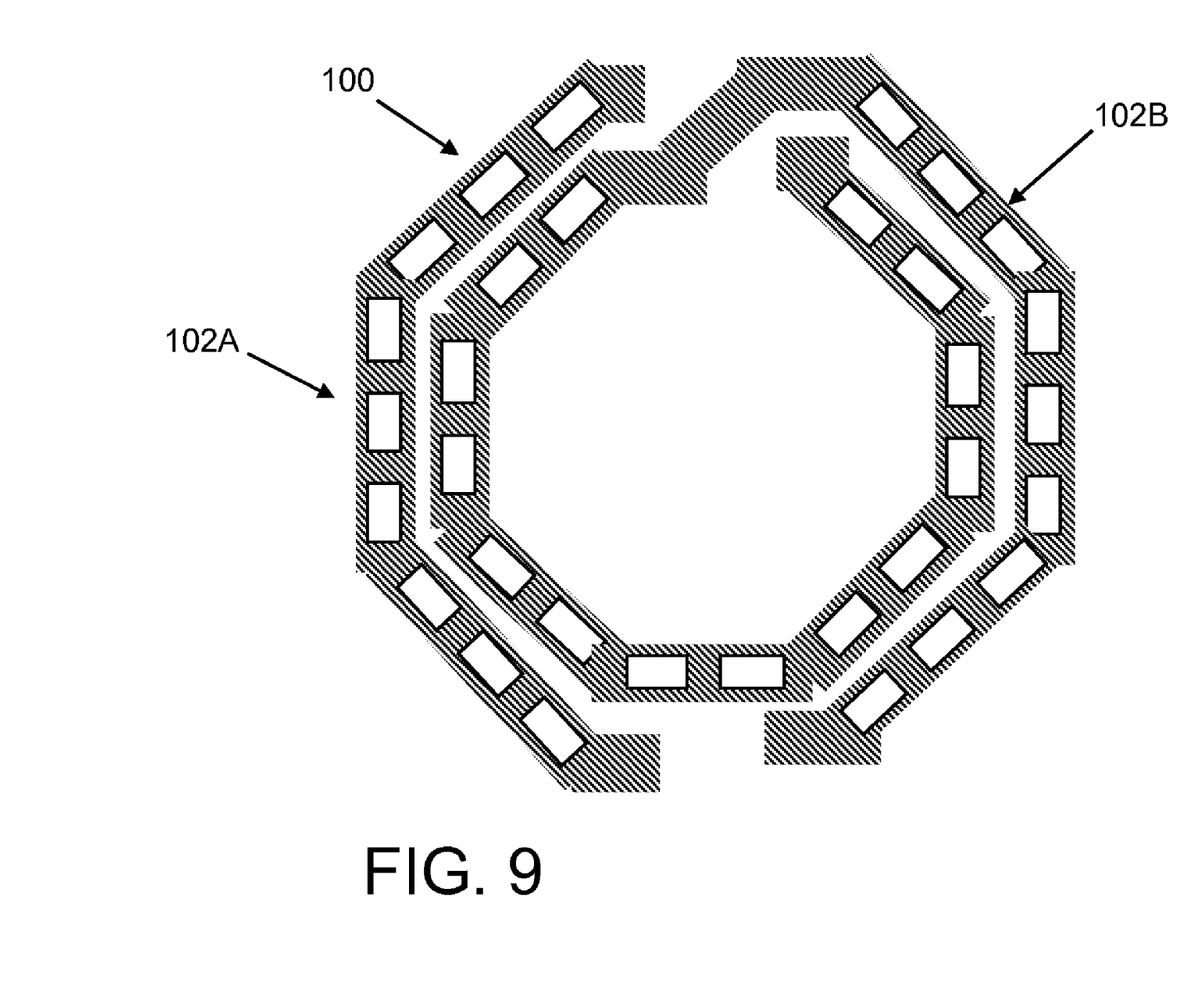
FIG. 9 shows an alternative embodiment of an inductor according to the disclosure.

Referring to FIG. 2, embodiments of an inductor 100 are illustrated. In one embodiment, inductor 100 comprises at least one conductive line 102A, 102B, 102C each including at least one turn 104. Although three conductive lines 102A-C have been illustrated, any number may be employed, e.g., the alternative embodiment of FIG. 9 shows only two conductive lines 102A-B. Conductive line 102A, 102B includes an opening 106 positioned within an interior of a region 122 of the respective conductive line 102A, 102B. That is, opening 106 is entirely within the interior of conductive line 102A, 102B and does not extend through a periphery thereof. As will be described in greater detail herein, region 122 has lower current density than other regions of conductive line 102A-B.

Each conductive line 102A-C may include a metal such as copper (Cu), aluminum (Al), gold (Au), in the form of a line formed in a dielectric 110. Dielectric 110 may include any dielectric now known or later developed for use within an integrated circuit (IC) chip such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon contained polymer material available form JSR Corporation, other low dielectric constant (<3.9) material, or layers thereof. Dielectric 110 fills between conductive lines 102A-C and fills opening(s) 106. Inductor 100 may be employed in any now known or later developed integrated circuit (IC) chip.

As shown, where opening(s) 106 includes a plurality of openings, they may be spaced substantially evenly along a longitudinal length of a conductive line 102A or 102B. FIG. 9 shows an alternative embodiment of inductor 100, also including substantially evenly spaced openings. However, this is not necessary. In one embodiment, opening 106 is substantially rectangular in shape; however, other shapes may also be employed.

In addition to the provision of opening(s) 106, inductor 100 may also include a conductive line 102B, 102C having a region 120 thinner than another region 122 of the conductive line. That is, region 120 of conductive line 102B, 102C is thinner than another conductive line 102A. In the conventional inductor shown in FIG. 1, the conductive lines have the same thickness in all regions. In one embodiment, thinner region 120 is located inwardly of an outermost region 122 of conductive line 102A-B.

Figure 3:
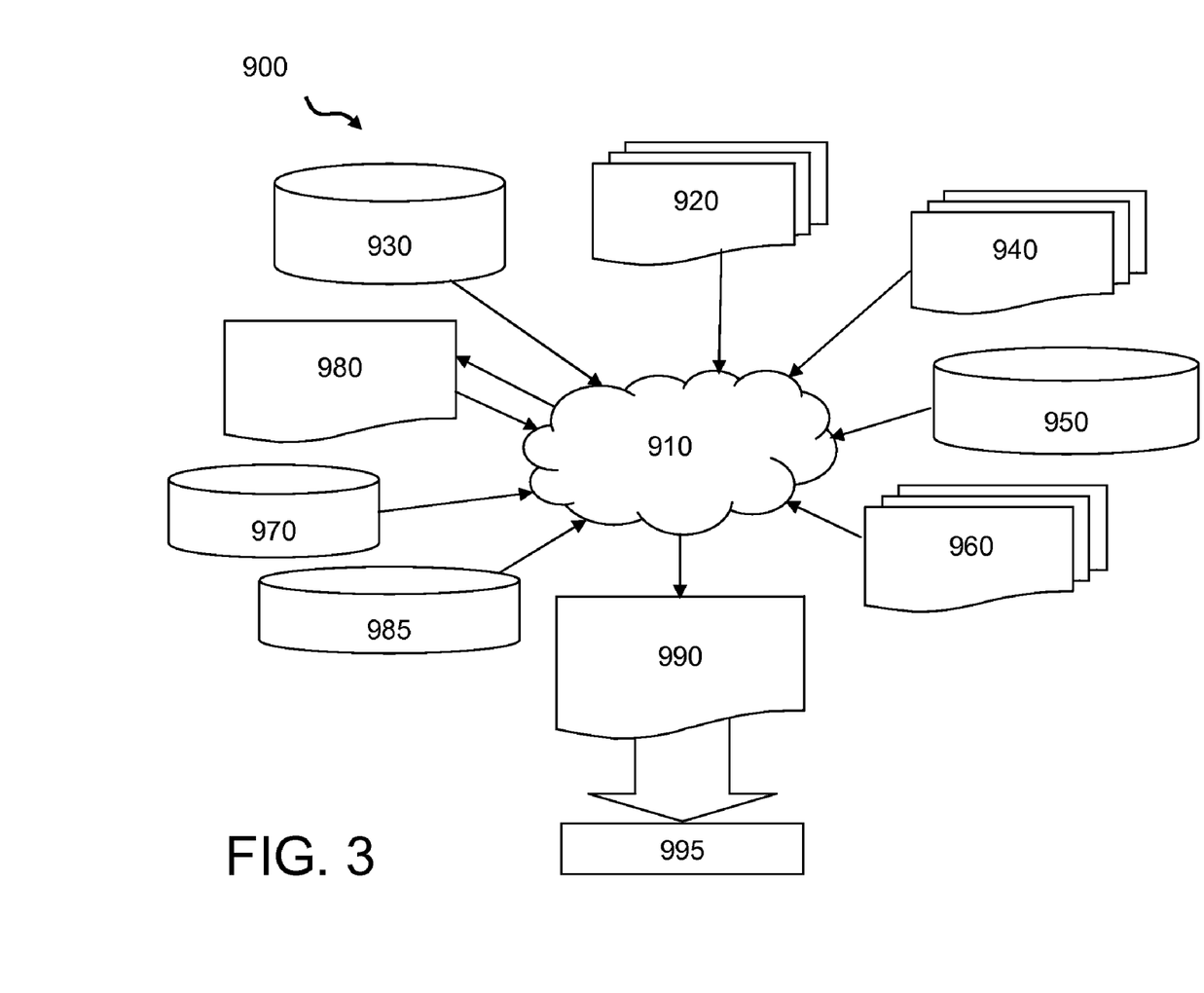
FIG. 3 shows a flow diagram of a design process used in semiconductor design, manufacture, and/or test.

FIG. 3 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the disclosure as shown in FIG. 2 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the disclosure as shown in FIG. 2. Design process 910 preferably synthesizes (or translates) an embodiment of the disclosure as shown in FIG. 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the disclosure. The design structure of the disclosure is not limited to any specific design flow.

Design process 910 preferably translates an embodiment of the disclosure as shown in FIG. 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the disclosure as shown in FIG. 2. Design structure 990 may then proceed to a stage 995 where, for example, design structure 990: proceeds to tape-out, is released to manufacturing, is released to a mask house, is sent to another design house, is sent back to the customer, etc.

Figure 4:
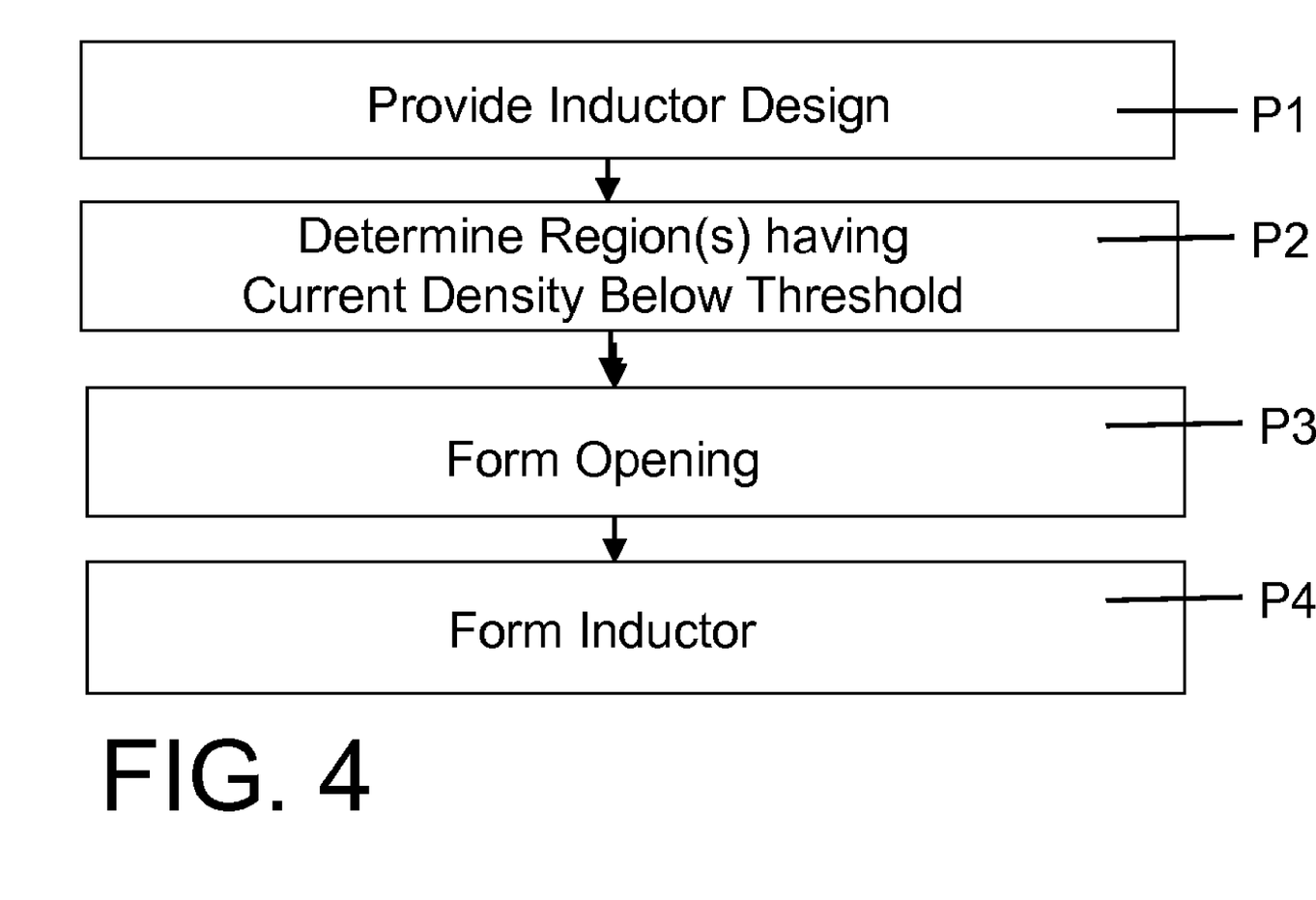
FIG. 4 shows a flow diagram of an illustrative design process of FIG. 3.
Figure 5:
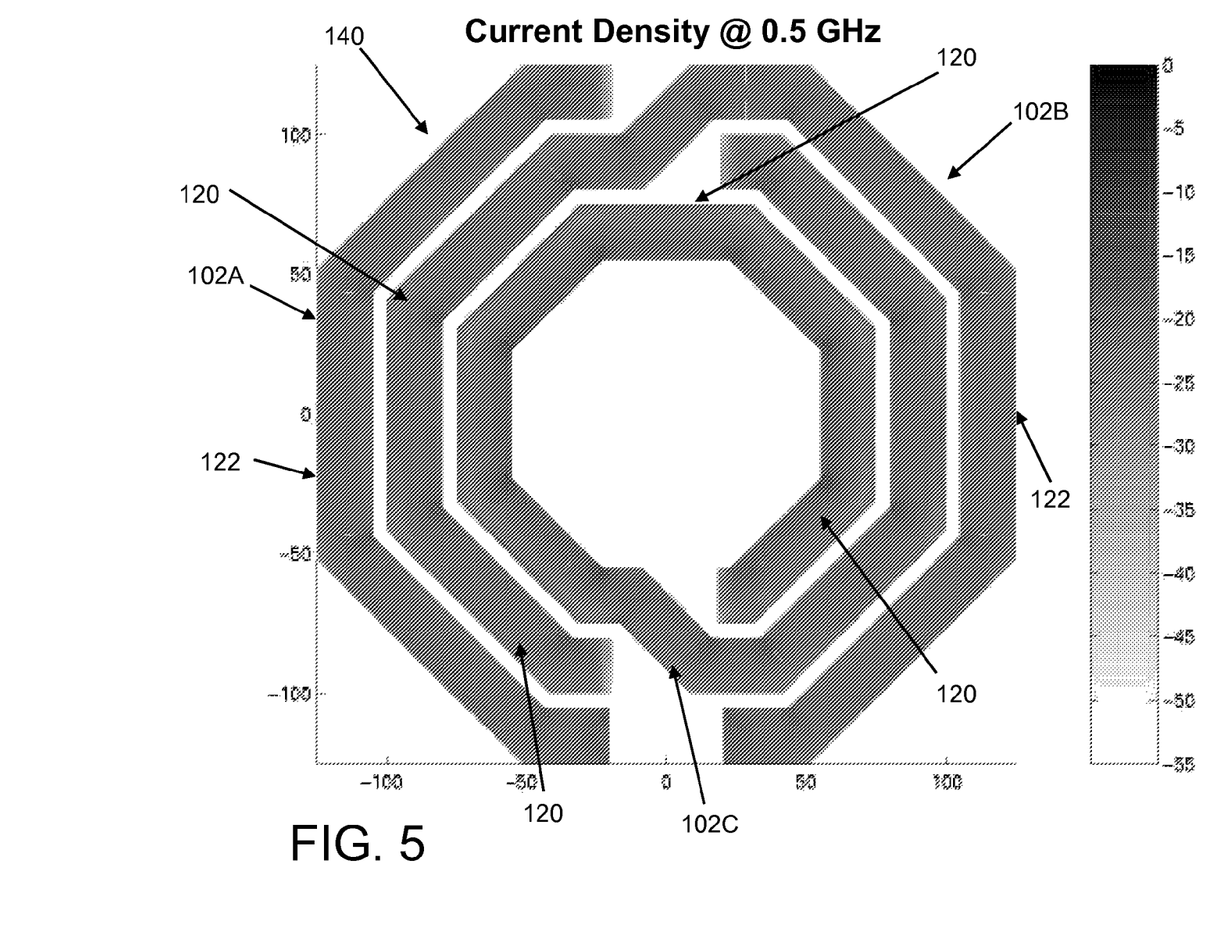
FIGS. 5-8 show electromagnetic (EM) simulations according to the disclosure.
Figure 6:
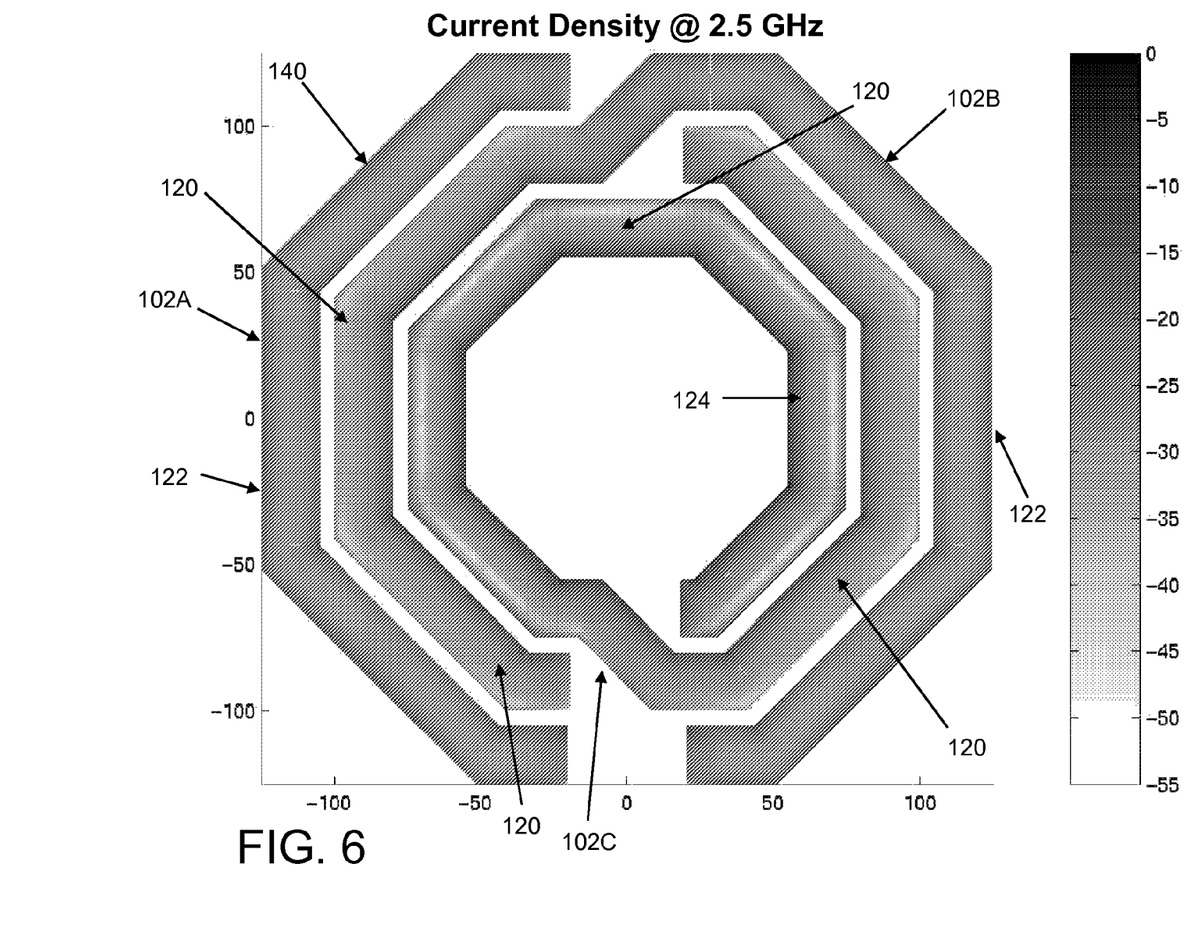

Turning to FIG. 4, one embodiment of a design process 910 is illustrated. In process P1, an inductor design (i.e., an initial design structure) including a conductive line having at least one turn is provided. An illustrative inductor design 140 is shown in FIGS. 5-6 as observed after electromagnetic simulation, as will be described in greater detail herein. Inductor design 140 may have uniform width conductive lines, similar to the conventional inductor of FIG. 1. Note, inductor design 140 has the same general layout as inductor 100 in FIG. 2, but has uniform width conductive lines. Inductor design 140 may be obtained using any of the above-described inputs to design process 910 (FIG. 3).

In process P2, a region 122 of conductive line 102A-C in inductor design 140 that has current density below a threshold is determined. The threshold may be context specific current density value, i.e., it may vary depending on the setting within an IC chip. In one embodiment, the determining may include performing an electromagnetic (EM) simulation of the inductor design. The EM simulation may be performed at a frequency at which a quality (Q) factor of the inductor design is to be maximized. FIGS. 5-6 show EM simulation results for inductor design 140. FIG. 5 shows results at 0.5 GigaHertz (GHz) and FIG. 6 shows results at 2.5 GHz. The EM simulation current density results indicate regions having lower current density in lighter shades, and a change in shading indicates a gradient in current density. (Reference to the originally filed drawings may be necessary due to the black-and-white color limitations of the patent publication.) FIG. 5 shows that current density at 0.5 GHz is relatively uniform; however, as shown in FIG. 6, current density at 2.5 GHz is not uniform. That is, at 2.5 GHz, some regions of inductor design 140 are carrying more current than other regions, i.e., there is a non-uniform current density caused mostly by Eddy currents. This is indicated by the changes in shading and the darker areas (higher current density) along interior portions of conductive lines 102A-C. For example, regions 122 on outermost conductive lines 102A, 102B are carrying less current compared to others (e.g., region 124 near an interior of conductive line 102C), and hence are inefficient. This situation reduces the Q factor of inductor design 140.

Figure 7:
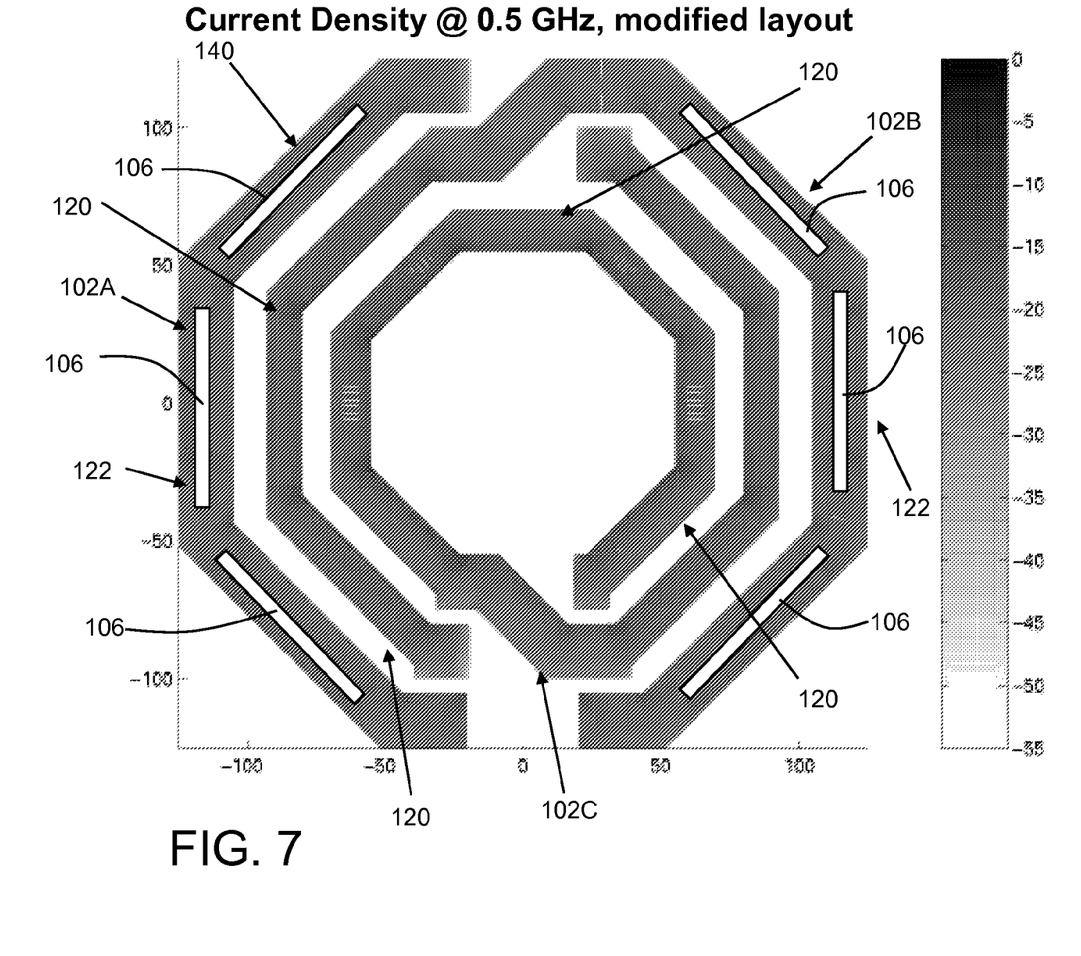
Figure 8:
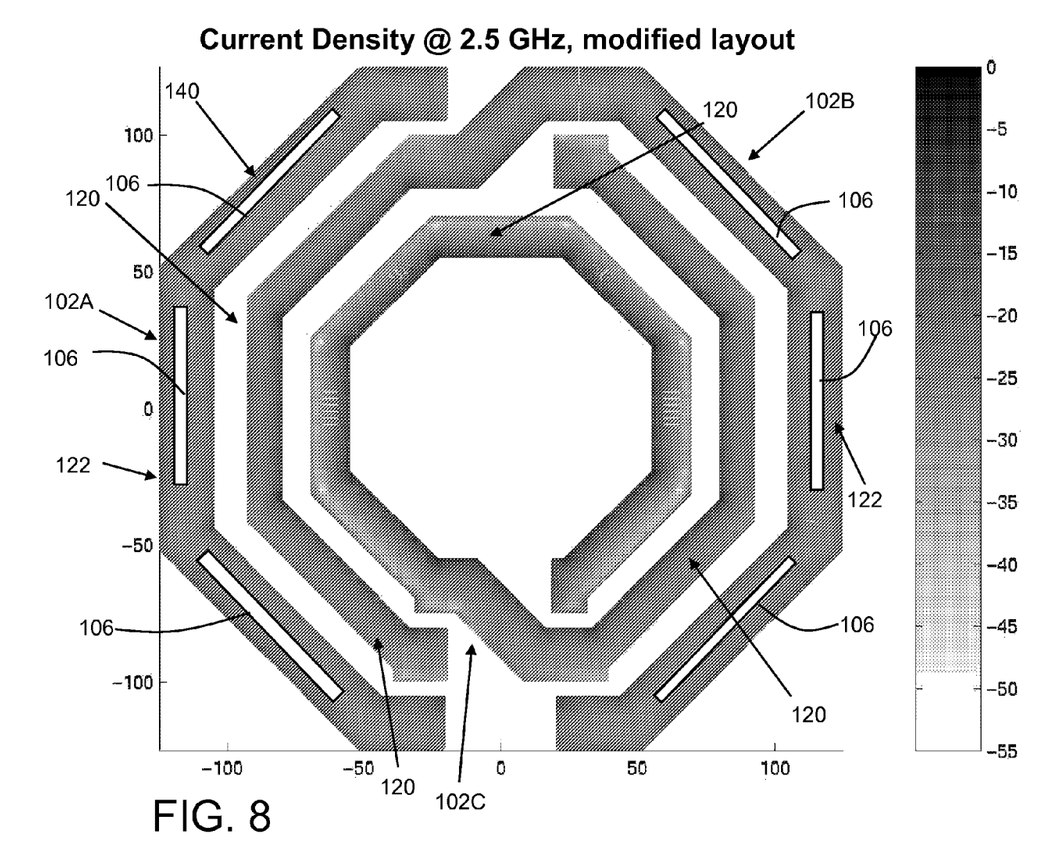

In order to address the situation, in process P3, an opening(s) 106 (FIG. 2) is formed in region 122, resulting in the structure of inductor 100 (FIG. 2). As described above, opening(s) 106 are enclosed within conductive line 102A-B. FIGS. 7-8 show EM simulation results for inductor design 140 including opening(s) 106. As illustrated, current density is more uniform through inductor design 140 than shown in FIGS. 5-6. Hence, formation of openings 106 through selective removal of portions of conductive lines 102A-B that are not considered (simulated) to adequately contribute to current flow, results in a more efficient inductor. Opening(s) 106 may be formed in inductor design 140 (i.e., inductor 100 in a design structure 920 form). In this case, opening 106 forming occurs prior to inductor 100 forming and includes forming the opening in inductor design 140 or forming the opening for the inductor in a mask used for the inductor forming. Alternatively, opening 106 forming may be provided as part of process P4 in which inductor 100 is formed in an IC chip (i.e., through etching out metal of conductive lines 102A-C and re-filling with dielectric 110). Process P4 may use any now known or later developed processes for forming conductive lines 102A-C such as forming a metal in dielectric 110 in a shape of inductor design 140 using conventional Damascene processing. Process P4 may include processing at a number of different levels where inductor 100 includes a stacked or otherwise multi-level arrangement, or it may be formed in a single layer. Inductor 100 may also have any now known or later developed layout including at least one turn such as a parallel, a spiral or a symmetrical arrangement.

Returning to process P2, this process may also include determining a plurality of regions 120, 122 having current density below a threshold. In some instances, rather than forming opening 106 (process P3), a region 120 may be formed or thinned compared to other regions 122 having opening 106. In one embodiment, thinner region(s) 120 may be formed in inductor design 140 (i.e., in design structure during design process 910 (FIG. 3)); however, in another embodiment, thinner regions 120 are formed as part of forming inductor 100 (process P4) including the opening 106 and based on inductor design 140. In the latter case, region(s) 120 may be thinned using, e.g., conventional laser trimming techniques. As shown in FIGS. 2, 7 and 8, thinner region 120 may be located inwardly of an outermost region (here 122) of conductive line 102A-C. However, this arrangement is not necessary. Thinning mostly benefits the inner turns (rings) of inductor 100. Accordingly, as shown in one embodiment in FIG. 2 the outermost regions include openings 106 whereas all inward regions are thinned. Note, conductive line 102A includes only regions 122, conductive line 102B includes both regions 120 and 122, and conductive line 102C includes only regions 120. It is understood that the placement of regions 120 and 122 may vary drastically depending on the layout of inductor 100. Thinner regions 120 may also be omitted, as shown in the alternative embodiment of FIG. 9.

Compared to conventional inductors, inductor 100 including opening(s) 106 in regions 122 where current flow is low (based on inductor EM simulations) reduces Eddy current formation, reduces metal and substrate capacitance, and improves manufacturability by making it easier to achieve pattern density requirements. In addition, inductor 100 allows for use of wider conductive lines 102A-C to maximize Q factor, while at the same time insuring optimal manufacturability by keeping pattern density requirements within a CMP process window. In addition, in contrast to other known processes, use of opening(s) 106 minimizes the impact of metal removal on sheet resistance while also maintaining symmetry throughout the structure. It is understood that the teachings of this disclosure could also be applied to other metal structures to enhance performance and overall manufacturability. For example, selective slotting or opening positioning based on current flow could be performed on transmission lines. Other applications include current flow based slotting for transformers and baluns.

The present disclosure relates to selective removal of conductor portions of an inductor where current flow is low. According to an embodiment of the disclosure, regions of low current flow in an inductor are determined by EM simulations; and the identified low current regions of the inductor are modified by removing portions of the inductor (e.g. thinning sections of an inner spiral, slotting sections of an outer spiral, etc.).

The methods and inductors described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An inductor comprising:
a first single conductive line including at least one turn; and a second single conductive line adjacent and coplanar with the first single conductive line and separated from the first single conductive line by a dielectric spacer, the second single conductive line at least partially surrounding the first single conductive line, wherein the second single conductive line includes at least one turn and an opening entirely contained within an interior of the second single conductive line, and wherein the first single conductive line is a solid line.

2. The inductor of claim 1, wherein a region proximate the opening has lower current density than other regions of the second single conductive line.

3. The inductor of claim 1, further comprising a plurality of openings spaced substantially evenly along a longitudinal length of the second single conductive line.

4. The inductor of claim 1, further comprising a third conductive single line including at least one turn.

5. The inductor of claim 1, wherein the second conductive single line further includes a region thinner than another region of the second conductive single line.

6. The inductor of claim 5, wherein the opening is positioned in an outermost region of the second conductive single line and the thinner region is located inwardly of the outermost region of the second conductive single line.

7. An integrated circuit (IC) comprising:
an inductor including:
a single conductive line including at least one turn; and
a plurality of conductive lines at least partially surrounded by the single conductive line,
wherein the single conductive line has a first portion and a second portion coplanar with the first portion and separated from the first portion by a dielectric spacer,
wherein the single conductive line has an opening entirely contained within an interior of the single conductive line, and
wherein each of the plurality of conductive lines is a solid line.

8. The IC of claim 7, further comprising a plurality of openings spaced substantially evenly along a longitudinal length of the single conductive line.

9. The IC of claim 7, wherein a region proximate the opening has lower current density than other regions of the single conductive line.

10. The IC of claim 7, wherein the plurality of conductive lines are each coplanar with the single conductive line, each of the plurality of conductive lines including at least one turn.

11. The IC of claim 7, wherein the single conductive line further includes a region thinner than another region of the single conductive line, and the opening is positioned in an outermost region of the single conductive line and the thinner region is located inwardly of the outermost region of the single conductive line.

12. A design structure embodied in a machine readable medium for designing, manufacturing, or testing an integrated circuit, the design structure comprising:
an inductor including:
a single conductive line including at least one turn; and
a plurality of conductive lines at least partially surrounded by the single conductive line,
wherein the single conductive line has a first portion and a second portion coplanar with the first portion and separated from the first portion by a dielectric spacer,
wherein the single conductive line has an opening entirely contained within an interior of the single conductive line, and
wherein each of the plurality of conductive lines is a solid line.

13. The design structure of claim 12, wherein the design structure comprises a netlist.

14. The design structure of claim 12, wherein the design structure resides on storage medium as a data format used for the exchange of layout data of integrated circuits.

15. An inductor comprising:
a central dielectric region;
a first single conductive line at least partially surrounding the central dielectric region, the first single conductive line being a solid line; and
a second single conductive line adjacent to and coplanar with the first single conductive line and separated from the first single conductive line by a dielectric space,
wherein the second single conductive line has an opening entirely contained within an interior of the second single conductive line,
wherein the second single conductive line is farther from the central dielectric region than the first single conductive line.

16. The inductor of claim 15, wherein the second single conductive line further includes a plurality of openings entirely contained within the interior of the second single conductive line.

17. The inductor of claim 15, wherein the opening has a substantially rectangular shape.

18. The inductor of claim 15, wherein the second single conductive line has at least one turn.

* * * * *